United States Patent [19]
Simmonds

[11] Patent Number: 5,139,192
[45] Date of Patent: Aug. 18, 1992

[54] SUPERCONDUCTING BONDS FOR THIN FILM DEVICES

[75] Inventor: Michael B. Simmonds, Del Mar, Calif.

[73] Assignee: Quantum Magnetics, Inc., San Diego, Calif.

[21] Appl. No.: 845,037

[22] Filed: Mar. 3, 1992

Related U.S. Application Data

[63] Continuation of Ser. No. 575,164, Aug. 30, 1990, Pat. No. 5,110,034.

[51] Int. Cl.⁵ .................. H01L 21/607; H01L 39/00; B23K 20/10
[52] U.S. Cl. ...................... 228/179; 228/111; 228/208; 228/263.19; 174/94 R; 505/927
[58] Field of Search ............... 228/179, 110, 111, 123, 228/208, 263.19, 904; 174/94 R; 505/925, 927

[56] References Cited

U.S. PATENT DOCUMENTS

| | | | |
|---|---|---|---|
| 3,346,351 | 10/1967 | Flashman | 505/927 |
| 4,403,189 | 9/1983 | Simmonds | 505/846 |
| 5,031,822 | 7/1991 | Humpston et al. | 228/208 |
| 5,110,034 | 5/1992 | Simmonds | 505/927 |

*Primary Examiner*—Samuel M. Heinrich
*Attorney, Agent, or Firm*—Baker, Maxham, Jester & Meador

[57] ABSTRACT

A method of bonding a superconductive ribbon lead to a superconductive bonding pad connected to superconducting circuitry. The thin ribbon is first coated with a fresh layer of the same material from which it is made and then a very thin layer of a noble metal is applied over that fresh layer. The bonding pad is also prepared with a very thin layer of the noble metal. Those coated surfaces are placed in facing contact and ultrasonically bonded.

26 Claims, 1 Drawing Sheet

5,139,192

SUPERCONDUCTING BONDS FOR THIN FILM DEVICES

This is a continuation of copending application Ser. No. 07/575,164 filed on Aug. 30, 1990, now U.S. Pat. No. 5,110,034.

FIELD OF THE INVENTION

This invention relates generally to thin film superconducting devices and more particularly to a method and apparatus for bonding a thin ribbon superconducting lead to a thin film bonding pad on the device substrate. More specifically, the purpose of the invention is to make reliable superconducting bonds of niobium ribbon to a thin film contact pad of niobium, employing a coating of palladium on at least one of the elements being bonded.

BACKGROUND OF THE INVENTION

Presently it is common to use a contact pad of lead to which a lead wire is connected by means of thermocompression bonding. Disadvantages with the use of lead relate to the fact that thin lead films and fine lead wires are both mechanically fragile and sensitive to oxidation. These factors, plus the fact that niobium superconduts at 9° K. while lead superconducts at 7° K., become coupled with the fact that niobium is less fragile then lead and is less sensitive to oxidation, with the result that there has been greater use of niobium in making superconductor connections. If either the pad or the wire is made of niobium, it is undesirable to introduce lead into the process. Also, since the superconducting transition temperature is lower for lead than it is for niobium, it is advantageous to use niobium for both elements.

While these reasons exist for using niobium in superconducting connections, it has not been possible to make a reliable niobium bond. Superconducting contacts of niobium have been made to niobium films using pressure contacts for niobium wires or raised bumps on larger niobium terminals. An example of pressure contacts together with raised bumps is shown in U.S. Pat. No. 4,403,189. While reliable connections can be provided by these means, bulky and mechanically complicated structures are required to maintain the correct pressure for the contact in the face of extreme thermal cycling, which, in these cases, is room temperature to the temperature of liquid helium. Other types of clamps have been used to make electrical contact between a niobium wire or ribbon and a niobium pad. However, not only are they difficult to handle, a bond is not thereby made but it is merely a mechanically clamped connection.

SUMMARY OF THE INVENTION

Broadly speaking, this invention concerns a method of bonding a superconductive electrical ribbon or wire lead to a superconductive thin film pad of similar material on a substrate, where the interfacing surfaces of at least one of those elements is coated with a very thin layer of a different material which readily connects to the superconductive material by means of cohesion. More specifically, both the pad and the lead are made of niobium and the coating material is palladium. The pad and lead are capable of being ultrasonically bonded to form a reliable electrical contact.

The preferable version of the invention is to create a thin ribbon of niobium, atomically clean it with a plasma of high energy argon ions, sputter coat it with a layer of niobium to create a fresh superconductive surface and then sputter coat it with a very thin layer of palladium. The thin film pad of niobium is preferably also coated with a very thin film layer of palladium and the two palladium coated surfaces are placed in facing contact and bonded ultrasonically.

Alternatives to the preferred embodiment specified above include a coating of only one niobium surface with palladium as well as not using the freshening coating of niobium. Instead of using the typical substrate of silicon on which the thin film pads are formed, it is possible to use other substrate materials such as sapphire which are harder and would improve the bonding process.

BRIEF DESCRIPTION OF THE DRAWING

The objects, advantages and features of this invention will be more clearly perceived from the following detailed description, when taken in conjunction with the accompanying drawing, in which.

DESCRIPTION OF THE PREFERRED EMBODIMENTS

Figure 1:
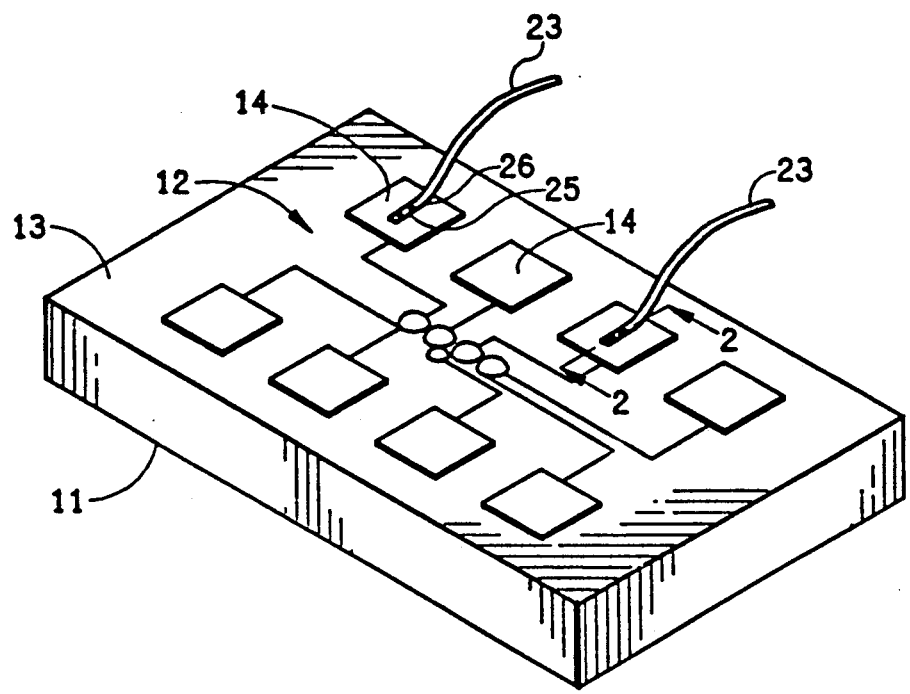
FIG. 1 is a perspective view of a typical silicon substrate with thin film superconducting circuitry on the top surface thereof with electrical leads connected to the circuitry according to the present invention.
Figure 2:
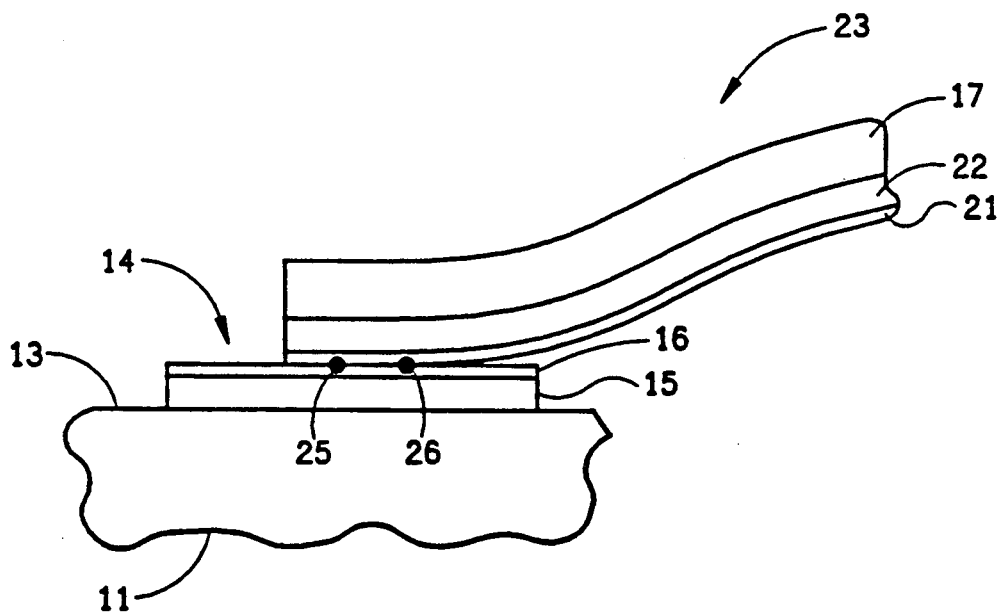
FIG. 2 is an enlarged partial sectional view, not to scale, taken through cutting plane 2—2 of FIG. 1.

With reference now to the drawing, there is shown a conventional silicon substrate 11 having typical superconducting circuitry 12 mounted on surface 13 of the substrate. Contact pads 14 are provided for external connection to superconducting electrical leads 23. These pads, in accordance with the invention, are formed of niobium thin film layer 15 having a palladium coating 16 on the upper surface thereof. Ultrasonically bonded to pad 14 is lead 23 comprised of niobium ribbon wire 17 having a coating 21 of palladium facing and contacting the coating of palladium on the pad. In between niobium ribbon 17 and palladium coating 21 is niobium coating 22. The relative thicknesses of these elements is not accurately shown in FIG. 2 but examples of actual thicknesses are set out below.

Details of the specific embodiment of the invention described above will now be set forth. Bonding pad 14 on chip or substrate 11 typically comprises a thin film of sputtered niobium which may be about 500 nm thick. While that thickness is presently preferred, it is believed that the pads can range from about 300 nm to about 600nm and have the desired characteristics. This pad is then sputter-coated with a very thin layer 16 of palladium which is typically about 10 nm thick. It should be noted that palladium is not a superconducting element. However, such a thin coating of palladium does not present a barrier to super currents because of a phenomena known as the proximity effect which causes superconductivity to be induced in the film of palladium as super current passes between the two superconducting niobium elements.

The process by which ribbon 23 is prepared is as follows. Starting with a commercially pure, annealed niobium foil about 0.001 inch thick, that foil is etched in a bath of nitric and hydrofluoric acid until it has been eroded to a thickness of about 0.0001 inch. The foil is then carefully rinsed and dried. This foil is then loaded into a sputtering chamber where it is atomically cleaned using a plasma of high energy argon ions. In the preferred embodiment, layer 22 of approximately 300 nm (ranging between 1 nm and 500 nm) is sputter deposited onto the foil to provide a tightly adhering interface of fresh superconductive niobium to enhance the cohesion of layer 21 of palladium thereto. The palladium layer is sputter coated onto the foil immediately after the layer of niobium. This palladium layer is very thin, again about 10 nm thick.

The thus prepared foil is removed from the sputtering chamber and cut into strips about 0.01 inch wide by 0.2 inch long which are stored until needed for bonding to the contact pads on a chip.

The bonding is preferrably done using a standard ultrasonic bonder such as the K&S Model 484 which has a titanium bonding tool with a cross groove tip having a head dimension of 0.002 by 0.002 inch. The power level used is approximately twice that required for making bonds with 0.001 inch diameter gold wire with otherwise the same configuration. The pressure required is considerably higher for bonds of niobium foil ribbon to the thin film niobium pads. About 60 grams is required, just short of the pressure which would cause cratering of the silicon substrate under the film of niobium.

On the K&S Model 484, the dial reading for pulse times ranges from 0 to a maximum of 10. The pulse time preferably employed for the bond described above is set at level 4 on the time control dial for the bonder, which provides about a 0.1 second pulse time duration. As is well known in the art, with any ultrasonic bonding procedures, the times, pressures and power which are required depend on many variables and must be optimized for the particular tool, substrate and materials involved. The specifics set forth above are merely examples but are appropriate for the set of parameters given.

Normally two bonds, 25 and 26, are made on each niobium ribbon spaced from each other along that portion of the ribbon in contact with pad 14. Although a single bond could be adequate, the use of two bonds improves the strength of the attachment since the strip is not able to pivot as it possibly could if only a single bond were used.

It is presently believed that the niobium foil ribbon should be less than a critical thickness of about 0.0003 inch for the above process to work reliably. More energy is required when the foil is thicker, and beyond a certain threshold, this energy is enough to possibly shatter the substrate underneath the sputtered film pad. On the other hand, it is believed that a foil about 500 nm thick could be employed, but it is believed that the minimum practical thickness for niobium ribbon 23 would be about 0.00003 inch, or about 900–1,000 nm.

The bonding technique and the bonds made thereby may be advantageously employed for connections to SQUID sensors, superconducting thin film transformers or any other type of superconducting thin film circuit. The distal ends of the niobium ribbons may easily be connected to an external lead by spot welding, by an ultrasonic process, or by other appropriate means.

The advantages of the technique of the present invention over earlier approaches are several. Niobium is much more rugged and is a stronger superconductor then is lead which has generally been used previously. An ultrasonic bond does not require a complicated, bulky and expensive clamping structure as does a pressure contact arrangement. The strips of niobium can be made very small so that many contacts can be made in a small area. This would permit a high level of integration not possible with mechanical clamping techniques previously used for niobium superconducting contacts. These advantages are provided by the use of ultra-thin foils for ultrasonic bonding. It is accentuated by the use of a noble metal flash (palladium) over a refractory metal (niobium) to improve the bonding characteristics. It is believed that it has not previously been possible to use ultrasonic bonding to attach niobium, or any other refractory metal, to thin films of the same materials for superconductive uses.

It is possible that the silicon substrate can be replaced by sapphire, which is a harder substance, so that the substrate will be less likely to crater and may give a somewhat wider window for bonding energy and pressure. Only niobium is mentioned for this bonding process but other refractory superconducting metals could be used. One possible example is tantalum. Nobles metals which are possible alternatives to palladium are platinum and gold.

Although the preferred embodiment includes a niobium foil with a freshening coating of niobium and with a very thin coating of palladium on the niobium coating to be bonded to a palladium coated niobium pad, the invention can be used in a somewhat simpler form. A reliable bond can be formed with only one of the niobium surfaces being coated with palladium. Under some circumstances the clean surface of the niobium foil would not absolutely require a fresh niobium coating in order to make a niobium-palladium-niobium bond by ultrasonic means.

In view of the above description, it is likely that modifications and improvements will occur to those skilled in the art which are within the scope of the accompanying claims.

What is claimed is:

1. A method of bonding a superconductive electrical lead to a superconductive thin film pad on a substrate, said method comprising the steps of:
   forming a thin film bonding pad of superconductive material on the substrate, the pad having a contact surface;
   forming a wire of similar superconductive material, the wire having a facing surface;
   coating at least one of the pad contact surface and the wire facing surface with a very thin layer of a different material which readily coheres to the superconductive surface material;
   placing the different-material coated surface in contact with the other superconductive material surface; and then
   bonding the wire to the bonding pad.

2. A method of bonding a superconductive electrical lead to a superconductive thin film pad on an electrically insulating substrate, said method comprising the steps of:
   forming a thin film bonding pad of niobium on the substrate, the pad having a contact surface;
   forming a wire of niobium, the wire having a facing surface;
   coating at least one of the niobium pad contact surface and wire facing surface with a very thin layer of palladium;
   placing the palladium coated surface and the niobium surface of the other element in contact; and then ultrasonically bonding the wire to the bonding pad.

3. The method recited in claim 2, and comprising the further step of coating the other of the contacting niobium surfaces with palladium prior to the placing step.

4. The method recited in claim 2, wherein the wire is about an order of magnitude thicker than the bonding pad.

5. The method recited in claim 2, wherein the bonding pad is about 30 to 60 times thicker than the palladium coating.

6. The method recited in claim 2, wherein the niobium film bonding pad has a thickness ranging between 300 nm and 600 nm.

7. The method recited in claim 2, wherein the niobium wire has a thickness ranging between 0.00003 and 0.0003 inch.

8. The method recited in claim 2, wherein the palladium layer is about 10 nm thick.

9. The method recited in claim 2, and comprising the further step of coating one surface of the niobium wire with a layer of niobium before applying the palladium coating thereover.

10. The method recited in claim 9, wherein the coating of niobium on the niobium wire ranges between 1 and 500 nm thick and the palladium layer is about 10 nm thick.

11. The method recited in claim 1, wherein the thin film bonding pad superconductive material is a refractory metal.

12. The method recited in claim 11, wherein the superconductive metal is niobium.

13. The method recited in claim 11, wherein the superconductive metal is tantalum.

14. The method recited in claim 1, wherein the different material is a noble metal.

15. The method recited in claim 14, wherein the noble metal is palladium.

16. The method recited in claim 14, wherein the noble metal is platinum.

17. The method recited in claim 14, wherein the noble metal is gold.

18. The method recited in claim 1, wherein the wire is about an order of magnitude thicker than the bonding pad.

19. The method recited in claim 1, wherein the bonding pad is about 30 to 60 times thicker than the different material coating.

20. The method recited in claim 1, and comprising the further step of coating the other of the pad contact surface and the wire facing surface with a very thin layer of the different material.

21. The method recited in claim 1, wherein the bonding step is accomplished ultrasonically.

22. The method recited in claim 1, and comprising the further step of coating the wire with a layer of the same superconductive material before applying the different material coating thereover.

23. The method recited in claim 1, wherein the bonding pad has a thickness ranging between 300 nm and 600 nm.

24. The method recited in claim 1, wherein the wire has a thickness ranging between 0.00003 and 0.0003 inch.

25. The method recited in claim 1, wherein the different material coating is about 10 nm thick.

26. The method recited in claim 22, wherein the superconductive material coating ranges between 1 and 500 nm thick and the different material coating is about 10 nm thick.

* * * * *